(12) United States Patent
Morita et al.

(10) Patent No.: US 7,914,854 B2
(45) Date of Patent: Mar. 29, 2011

(54) FILM-FORMING COMPOSITION

(75) Inventors: Toshiro Morita, Kanagawa (JP); Isao Sato, Kanagawa (JP)

(73) Assignee: Tokyo Ohka Kogyo Co., Ltd., Kanagawa (JP)

( * ) Notice: Subject to any disclaimer, the term of this patent is extended or adjusted under 35 U.S.C. 154(b) by 308 days.

(21) Appl. No.: 12/160,176

(22) PCT Filed: Dec. 19, 2006

(86) PCT No.: PCT/JP2006/325261
§ 371 (c)(1),
(2), (4) Date: Jul. 7, 2008

(87) PCT Pub. No.: WO2007/083470
PCT Pub. Date: Jul. 26, 2007

(65) Prior Publication Data
US 2009/0014845 A1    Jan. 15, 2009

(30) Foreign Application Priority Data

Jan. 18, 2006  (JP) .................................. 2006-009430

(51) Int. Cl.
*C08L 83/04* (2006.01)
*B05D 3/02* (2006.01)

(52) U.S. Cl. ........ 427/387; 524/409; 524/410; 524/414; 524/437; 524/439; 524/588

(58) Field of Classification Search ........................ None
See application file for complete search history.

(56) References Cited

U.S. PATENT DOCUMENTS

| | | | | |
|---|---|---|---|---|
| 3,514,348 A | * | 5/1970 | Ku | ................................ 438/563 |
| 4,929,995 A | * | 5/1990 | Gifford | ......................... 257/530 |
| 6,695,903 B1 | * | 2/2004 | Kubelbeck et al. | ....... 106/287.14 |
| 7,226,803 B2 | * | 6/2007 | Mouli et al. | .................... 438/59 |
| 7,468,485 B1 | * | 12/2008 | Swanson | ....................... 136/243 |

FOREIGN PATENT DOCUMENTS

| | | |
|---|---|---|
| JP | H2-188914 A | 7/1990 |
| JP | H3-55828 A | 3/1991 |
| JP | H5-326432 A | 12/1993 |
| JP | 2002-124692 A | 4/2002 |
| JP | 2003-158277 A | 5/2003 |
| TW | 518660 B | 1/2003 |
| TW | I247332 B | 5/2005 |
| TW | I242245 B | 10/2005 |

OTHER PUBLICATIONS

International Search Report issued in PCT/JP2006/325261 on Mar. 20, 2007.
Notice of Reasons for Rejection and Search Report issued to TW Application No. 96101650, mailed Jul. 2, 2010, translation of search report included, 5 pages.

* cited by examiner

*Primary Examiner* — Marc S Zimmer
(74) *Attorney, Agent, or Firm* — Pattric J. Rawlins; Procopio Cory Hargreaves & Savitch LLP (57) ABSTRACT

An $SiO_2$-based film-forming composition giving a protective film which, after impurity diffusion, can be easily stripped off and which has a higher protective effect. The film-forming composition is one for forming a protective film which in the diffusion of an impurity into a silicon wafer, serves to partly prevent the impurity diffusion. This film-forming composition comprises a high-molecular silicon compound and a compound having a protective element which undergoes covalent bonding to the element to be diffused in the impurity diffusion and thereby comes to have eight valence electrons. The protective element is preferably gallium or aluminum when phosphorus is used as the element to be diffused, and is preferably tantalum, niobium, arsenic, or antimony when boron is used as the diffusion element.

6 Claims, 4 Drawing Sheets

FILM-FORMING COMPOSITION

CROSS-REFERENCE TO RELATED APPLICATION

This application is the United States national stage application of international application serial number PCT/JP2006/325261, filed Dec. 19, 2006, which claims priority to Japanese Patent Application number 2006-009430, filed Jan. 18, 2006, each of which is incorporated herein by reference in its entirety.

TECHNICAL FIELD

The present invention relates to a composition for a protective film provided when a dopant is diffused into a substrate in production processes of semiconductors. More particularly, the present invention relates to a composition for a protective film which exhibits a great protective effect and can be readily detached and removed from the substrate after diffusing the dopant.

BACKGROUND ART

In the step of diffusing a dopant in production processes of semiconductors, a pattern forming step of a protective film using a photolithography technique is first carried out, and subsequently the selective diffusion step of an intended dopant into the substrate (doping) is carried out by thermal diffusion or ion implantation using the protective film as a mask.

More specifically, for example, a resist is coated on the surface of a silicon substrate which was entirely covered with an oxide film. Next, thus formed resist film is exposed and developed using a photolithography technique, thereby removing the resist film selectively. Thereafter, the oxide film at the part where the resist film was removed is removed by etching to allow the silicon substrate to be exposed. A diffusive dopant is supplied by vapor deposition or the like onto the silicon substrate to accumulate the dopant. The remaining resist is removed to produce a semiconductor element.

In this production process, diffusion of the dopant, such as phosphorus having five valence electrons, into the silicon substrate on which the resist film and the oxide film were removed leads to generation of a free electron from one residual electron. Accordingly, the part of the silicon substrate in which the dopant is diffused serves as a semiconductor. Therefore, it is necessary to protect with the protective film at the part where the diffusion of the dopant should be avoided so as not to permit diffusion of the dopant. In the foregoing process, a silicon oxide film plays a role as the protective film.

Meanwhile, solar batteries include a junction of a p-type semiconductor and an n-type semiconductor (p-n junction). When a light is irradiated on the semiconductor, a combination of an electron (−) and a positive hole (+) is generated. The generated electron and positive hole are accumulated on both sides of the junction. The light entered in the solar battery produces an electric current and a voltage, and the electric current and the voltage produced by the light can be used as an electric power.

When, for example, a p-type semiconductor is provided on one surface of such a solar battery, a dopant having three valence electrons is diffused. In this process, it is necessary to protect another surface by a protective film so as not to permit diffusion of the dopant.

As the protective film which can be used in such a process, for example, a protective film including a diffusion inhibitor that includes at least one selected from titanium, titanium oxide and a glass is disclosed (see Patent Document 1).

Patent Document 1: Japanese Unexamined Patent Application Publication No. 2003-158277

DISCLOSURE OF THE INVENTION

Problems to be Solved by the Invention

However, the protective film must be detached away after completing the dopant diffusion step. However, when titanium oxide is used as a protective film, it is difficult to detach the protective film after the diffusion. Although a silicon oxide film can be easily detached after the diffusion, such a film is disadvantageous in that the effect of protection from the dopant is inferior as compared to titanium oxide.

Furthermore, it is necessary to elevate the sintering temperature or to thicken the protective film for achieving a great protective effect when a silicon oxide film is used. However, when the sintering temperature is elevated, the production apparatus is constrained, and the deterioration of the silicon wafer which is a substrate is concerned about. Also, when the protective film is thickened, problems of time dependent alteration of the coating liquid for the protective film may be caused.

The present invention was made in view of the foregoing problems, and an object of the present invention is to provide an $SiO_2$-based protective film which can be readily detached after diffusing the dopant, and which exhibits a greater protective effect.

Means for Solving the Problems

In order to solve the abovementioned problems, the present inventors have conducted thorough experimentation, and focused their attention on the need for improvement of the protective effect of an $SiO_2$-based protective film in diffusing a dopant. Consequently, it was found that the problems can be solved by adding to a protective film a compound including an element which is to have eight valence electrons through covalently binding with a diffusion source used in diffusing a dopant, thereby achieving the completion of the present invention. More specifically, the present invention provides the following.

A first aspect of the present invention provides a film-forming composition for constituting a protective film provided in diffusing a dopant into a silicon wafer, for partially preventing the diffusion of the dopant, the composition including a polymeric silicon compound, and a compound including a protective element which is to have eight valence electrons through covalently binding with an element to be a diffusion source used in diffusing the dopant.

According to the present invention, a compound including a protective element which is to have eight valence electrons through covalently binding with an element to be a diffusion source used in diffusing the dopant is included in a film-forming composition for constituting a protective film. Thus, the protective element included in the protective film is covalently bound with the diffusion source to form a stable bond. Accordingly, the diffusion source can be trapped by the protective element included in the protective film, whereby effective protection from the diffusion source is enabled. Even though the diffusion source is diffused into the silicon wafer, an electrically neutral (negative-positive zero) state is provided by concurrent diffusion of the protective element, whereby effective protection from the diffusion source is enabled.

Also, the film-forming composition of the present invention contains a polymeric silicon compound. Therefore, the formed film can be more easily detached as compared with the case in which titanium oxide is used as the film-forming composition, leading to ease in production.

A second aspect of the present invention provides the film-forming composition according to the first aspect, in which the protective element is at least one selected from gallium and aluminum.

According to this aspect, since gallium and aluminum are trivalent elements, the diffusion of phosphorus that is a pentavalent element can be effectively protected.

A third aspect of the present invention provides a film-forming composition according to the first aspect, in which the protective element is one or more selected from phosphorus, tantalum, niobium, arsenic, or antimony.

According to this aspect, since phosphorus, tantalum, niobium, arsenic, or antimony as the protective element is a pentavalent element, the diffusion of boron that is a trivalent element can be effectively protected.

A fourth aspect of the present invention provides the film-forming composition according to any one of the first to third aspects, in which the compound including the protective element is a salt or alkoxide including the protective element.

According to this aspect, since the compound including the protective element is a salt or alkoxide, dissolution in the protective film is facilitated, thereby enabling uniform processing.

A fifth aspect of the present invention provides the film-forming composition according to any one of the first to fourth aspects, in which the compound including the protective element is included in the film-forming composition at a content of no lower than 5 ppm by mass to no higher than 2% by mass.

According to this aspect, the content in the film-forming composition falling within this range allows for effective protection from the diffusion source. When the content is too low, a sufficient protective effect cannot be achieved, while the electrical failure may be caused when the content exceeds 2% by mass.

A sixth aspect of the present invention provides a protective film produced by coating the film-forming composition according to any one of the first to fifth aspects on a silicon wafer, and sintering at no lower than 400° C. and no higher than 900° C.

According to this aspect, since the sintering temperature of the protective film is no lower than 400° C. and no higher than 900° C., deterioration due to the sintering of the silicon wafer which is a substrate can be prevented. Furthermore, since the production at no higher than 900° C. is enabled, restriction imposed from the apparatus for production can be precluded.

In a seventh aspect, the present invention provides the protective film according to the sixth aspect having a film thickness of no less than 500 Å.

According to this aspect, more dopant can be trapped because the protective film has a film thickness of no less than 500 Å.

EFFECTS OF THE INVENTION

Because the film-forming composition of the present invention includes a polymeric silicon compound as a principal component, the protective film can be more readily detached after diffusing the dopant, as compared with the protective film including titanium oxide as a principal component. Moreover, the protective film contains a compound including a protective element which is to have eight valence electrons through covalently binding with an element to be a diffusion source. Therefore, the dopant can be trapped by the protective element included in the protective film, whereby effective protection of the substrate from the dopant is enabled. Even though the diffusion source is diffused into the silicon wafer, an electrically neutral (negative-positive zero) state can be provided by concurrent diffusion of the protective element, whereby effective protection of the substrate from the dopant is enabled.

PREFERRED MODE FOR CARRYING OUT THE INVENTION

Hereinafter, embodiments of the present invention will be explained.
Film-Forming Composition The film-forming composition of the present invention will be explained below. The film-forming composition of the present invention is a film composition which includes a polymeric silicon compound, and a compound including a protective element which is to have eight valence electrons through covalently binding with an element to be a diffusion source used in diffusing the dopant.
[Polymeric Silicon Compound]

The polymeric silicon compound for use in the present invention is not particularly limited, and may be for example, one or more selected from the group consisting of a siloxane polymer compound having a Si—O bond in a main chain, a silicon carbide polymer compound having a Si—C bond in a main chain, a polysilane polymer compound having a Si—Si bond in a main chain, and a silazane polymer compound having a Si—N bond in a main chain. Moreover, any mixture of these compounds can be used. It is possible to select compounds as appropriate, in order to increase the selectivity ratio with the substrate to be used. Also, a siloxane polymer compound is particularly preferably used among these.
Siloxane Polymer Compound It is preferable that the siloxane polymer compound as the polymeric silicon compound in the film-forming composition of the present invention be a condensation polymerization product prepared using at least one kind of alkoxysilanes represented by the following formula (A) as a starting material.

$$R^1{}_n\text{—Si}(OR^2)_{4-n} \tag{A}$$

wherein, $R^1$ represents a hydrogen atom, or a monovalent organic group; $R^2$ represents a monovalent organic group; and n represents an integer of 1 to 3.

Here, as the monovalent organic group, for example, an alkyl group, an aryl group, an allyl group, and a glycidyl group may be exemplified. Among them, preferred are an alkyl group and an aryl group. Especially preferred is the alkyl group having 1 to 5 carbon atoms, such as e.g., a methyl group, an ethyl group, a propyl group and a butyl group. Also, the alkyl group may be linear or branched, and may include substitution of hydrogen atom with a fluorine atom. As the aryl group, preferred are those having 6 to 20 carbon atoms, such as e.g., a phenyl group and a naphthyl group.

Specific examples of the compound represented by the above general formula (A) include: (i) in the case of n=1, monoalkyltrialkoxysilane such as monomethyltrimethoxysilane, monomethyltriethoxysilane, monomethyltripropoxysilane, monoethyltrimethoxysilane, monoethyltriethoxysilane, monoethyltripropoxysilane, monopropyltrimethoxysilane and monopropyltriethoxysilane, and monophenyltrialkoxysilane such as monophenyltrimethoxysilane and monophenyltriethoxysilane; (ii) in the case of n=2, dialkyldialkoxysilane such as dimethyldimethoxysilane, dimethyldiethoxysilane, dimethyldipropoxysilane, diethyldimethoxysilane, diethyldiethoxysilane, diethyldipropoxysilane, dipropyldimethoxysilane, dipropyldiethoxysilane and dipropylpropoxysilane, and diphenyldialkoxysilane such as diphenyldimethoxysilane and diphenyldiethoxysilane; and (iii) in the case of n=3, trialkylalkoxysilane such as trimethylmethoxysilane, trimethylethoxysilane, trimethylpropoxysilane, triethylmethoxysilane, triethylethoxysilane, triethylpropoxysilane, tripropylmethoxysilane and tripropylethoxysilane, and triphenylalkoxysilane such as triphenylmethoxysilane and triphenylethoxysilane, and the like.

Among them, monomethyltrialkoxysilane such as monomethyltrimethoxysilane, monomethyltriethoxysilane and monomethyltripropoxysilane may preferably be used.

In the film-forming composition of the present invention, the weight average molecular weight of the condensate may preferably be no less than 200 and no greater than 50,000, and more preferably no less than 1,000 and no greater than 3,000 when the condensate of alkoxysilane represented by the formula (A) is included. When the condensate having the weight average molecular weight falling within this range is used, the coating properties of the film-forming composition can be improved. Also, in the presence of the condensate, adhesion between the substrate and the film formed from the film-forming composition can be improved.

The condensation of the alkoxysilane represented by the formula (A) is carried out by allowing the alkoxysilane to be a polymerization monomer to react in the presence of an acid catalyst in an organic solvent. With respect to the alkoxysilane as the polymerization monomer, it may be used alone or in combination of two or more to allow for condensation.

The degree of hydrolysis of alkoxysilane, which is a prerequisite of the condensation, can be adjusted by the quantity of water to be added. Generally, water at the proportion of 1.0 to 10.0 times mol, and preferably 1.5 to 8.0 times mol, is added to the total mol of alkoxysilane represented by the above formula (A). When the amount of water added is less than 1.0 time mol, the degree of hydrolysis becomes so low that the coating film formation may be difficult. In contrast, the molar ratio exceeding 10.0 times mol is likely to cause the gelation, whereby the storage stability may be inferior.

In addition, the acid catalyst used in condensation of the alkoxysilane represented by the formula (A) is not particularly limited, and any one of conventionally used organic acids and inorganic acids can be employed. Examples of the organic acid include organic carboxylic acids such as acetic acid, propionic acid and butyric acid, and examples of the inorganic acid include hydrochloric acid, nitric acid, sulfuric acid, phosphoric acid, and the like. The acid catalyst may be either directly added to a mixture of the alkoxysilane and water, or may be added as an acidic aqueous solution together with water which should be added to the alkoxy metal compound.

The hydrolysis reaction is usually completed in about 5 to 100 hours. Also, the reaction time required to complete the hydrolysis reaction can be reduced by allowing for the reaction through adding an aqueous acid catalyst solution dropwise to an organic solvent containing at least one alkoxysilane represented by the formula (A), at a heating temperature between a room temperature and an elevated temperature not exceeding 80° C. The hydrolyzed alkoxysilane thereafter causes a condensation reaction to form a network of Si—O—Si as a result.

[Compound Including Protective Element]

The compound including the protective element for use in the present invention is a compound that includes a protective element which is to have eight valence electrons through covalently binding with an element to be a diffusion source used in diffusing the dopant. As the diffusion source, in general, phosphorus or boron is frequently used.

When phosphorus is used as the diffusion source, gallium or aluminum is preferably used as the protective element. Also, when boron is used as the diffusion source, tantalum, niobium, arsenic, or antimony is preferably used as the protective element.

The compound including the protective element may be included in the film-forming composition at a content by mass of preferably no lower than 5 ppm to no higher than 2%, and more preferably no lower than 100 ppm to no higher than 1%. A sufficient protective effect can be achieved by providing the compound including the protective element at the content not below the aforementioned lower limit. Moreover, it is possible to prevent the electrical failure by providing the compound at the content not exceeding the aforementioned upper limit.

Also, the compound including the protective element can be added in the form of the oxide, halide, salt such as the inorganic acid salt (nitrate, sulphate etc), organic salt (acetate), or alkoxide such as methoxide or ethoxide, to the film-forming composition. Specifically, gallium trichloride, gallium tribromide, gallium oxide, gallium nitrate, gallium citrate, aluminum chloride, aluminum bromide, aluminum nitrate, aluminum oxide, aluminum sulfate, aluminum acetate, aluminum benzoate, aluminum oxalate, aluminum citrate, aluminum methoxide, aluminum ethoxide, aluminum isopropoxide, aluminum sec-butoxide, aluminum tert-butoxide, tantalum pentachloride, tantalum pentabromide, tantalum pentoxide, tantalum ethoxide, tantalum n-butoxide, niobium pentoxide, niobium ethoxide, niobium n-butoxide, phosphorus oxychloride, antimony trioxide, antimony oxychloride, antimony trichloride, antimony tribromide, antimony tetroxide, antimony pentoxide, antimony sulfate, and the like can be exemplified.

[Other Components]

Surfactant

It is preferable to include a surfactant in the film-forming composition of the present invention. It is possible to improve coating properties on the substrate, smoothness and spreading properties by the presence of the surfactant.

Solvent

From the perspective of achieving improved coating properties and uniform film thickness, it is preferable that the film-forming composition of the present invention contain a solvent. As the solvent, any organic solvent which has been conventionally used can be employed. Specific examples include monohydric alcohols such as methyl alcohol, ethyl alcohol, propyl alcohol, butyl alcohol, 3-methoxy-3-methyl-1-butanol and 3-methoxy-1-butanol; alkyl carboxylate such as methyl-3-methoxypropionate and ethyl-3-ethoxypropionate; polyhydric alcohols such as ethylene glycol, diethylene glycol and propylene glycol; polyhydric alcohol derivatives such as ethylene glycol monomethyl ether, ethylene glycol monoethyl ether, ethylene glycol monopropyl ether, ethylene glycol monobutyl ether, propylene glycol monomethyl ether, propylene glycol monoethyl ether, propylene glycol monopropyl ether, propylene glycol monobutyl ether, ethylene glycol monomethyl ether acetate, ethylene glycol monoethyl ether acetate, propylene glycol monomethyl ether acetate and propylene glycol monoethyl ether acetate; fatty acids such as acetic acid and propionic acid; and ketones such as acetone, methylethylketone and 2-heptanone. These organic solvents may be used alone, or two or more of them may be used in combination.

The quantity of this solvent is not particularly limited, but the concentration (solid content) of the component, such as the polymeric silicon compound, other than the solvent is preferably 1 to 100% by mass, and more preferably 3 to 20% by mass. By adjusting to fall within this range, the coating properties can be improved.

Others

Moreover, in the present invention, it is possible to include other resins, additives and the like in the range not to impair the effects of the invention. It is possible to appropriately select the other compounding components depending on the function and the like desirable to impart to the protective film.

Protective Film Formation Method

The protective film of the present invention is formed by a protective film formation method including the steps of coating and sintering. Each step is hereinafter explained.

[Coating Step]

In the coating step, the film-forming composition of the present invention is applied on a substrate, thereby obtaining a coating layer of the film-forming composition. Examples of the method for coating include a spray coating method, a roll coating method, a spin-coating method, and the like. In the present invention, silicon can be used as a material for the substrate.

[Sintering Step]

The sintering step is for forming a cured film of the film-forming composition by sintering or partially sintering the coating layer of the film-forming composition provided on the substrate in the coating step. This cured film serves as a protective layer.

Although the conditions of the sintering or partial sintering are not limited in particular, the temperature is preferably no lower than 400° C. and no higher than 900° C., and more preferably no lower than 400° C. and no higher than 600° C. Satisfactory protective effect can be achieved by setting the sintering temperature not below the above lower limit. Also, the electrical failure (e.g., resistivity anomaly) can be prevented by setting the sintering temperature not exceeding the above upper limits. Furthermore, the sintering temperature not higher than 600° C., in particular, is even more preferred since diffusion of the protective element from the protective layer into the substrate can be prevented.

Particularly, the sintering temperature can be lowered in the above range by increasing the content of the protective element. For example, the protective effect can be improved by sintering at around 700° C. when the content of gallium is about 100 ppm. When this content is no lower than 300 ppm and no higher than 500 ppm, the temperature of no lower than 400° C. and no higher than 500° C. would lead to satisfactory results.

Although time period of the sintering or partial sintering is also not limited particularly, it is preferably carried out for 30 minutes or longer.

It is preferred that the protective film formed by the aforementioned method have a film thickness of no less than 500 Å. The film thickness of no less than 500 Å is sufficient for a protective film, whereby the substrate can be effectively protected from the diffusion source.

Dopant Diffusion Method

[Diffusion Layer Forming Step]

In the diffusion layer forming step, a dopant-containing composition, i.e., a composition that includes a dopant, is coated on the substrate on which the protective layer was formed, and then the diffusion layer is formed by baking. This baking temperature is not particularly limited, and it is about 150° C. to 300° C.

The dopant-containing composition which can be preferably used is, for example, the aforementioned film-forming composition in which the compound that contains the protective element is substituted with a compound for the dopant.

[Diffusion Step]

In the diffusion step, the dopant is diffused into the substrate. In this step, the dopant is diffused into the substrate from the diffusion layer by sintering in, for example, an inert gas atmosphere. For example, nitrogen and the like can be exemplified as the inert gas. Moreover, the sintering temperature may be about 700° C. to 1,000° C. The diffusion time period may be about 10 min to 60 min.

[Detachment Step]

In the detachment step, the cured film (protective layer) of the film-forming composition obtained by sintering or partially sintering in the sintering step is detached from the substrate. Also, the diffusion layer may be detached in a separate step, or may be detached concurrently in this detachment step. Herein, the step of detaching the protective layer using a detachment solution is exemplified. In this detachment step, the way how the detachment solution is brought into contact with the protective layer is not particularly limited, and various methods to meet the needs such as, for example: an immersion method in which the substrate having the protective layer formed thereon is immersed in the detachment solution for a certain period of time, followed by water washing and drying; a paddling method in which the detachment solution is dropped on the surface of the protective layer which is then allowed to stand still for a certain period of time, followed by water washing and drying; and a spraying method in which the detachment solution is sprayed on the surface of the protective layer, followed by water washing and drying, and the like may be involved.

Examples of the detachment solution include alkaline detachment solutions, and acidic detachment solutions. The alkaline detachment solution preferably contains at least one selected from an aqueous sodium hydroxide solution, water-soluble amine, and quaternary ammonium hydroxide.

Examples of the water-soluble amine include alkanolamines such as monoethanolamine, diethanolamine, triethanolamine, 2-(2-aminoethoxy)ethanol, N,N-dimethylethanolamine, N,N-diethylethanolamine, N,N-dibutylethanolamine, N-methylethanolamine, N-ethylethanolamine, N-butylethanolamine, N-methyldiethanolamine, monoisopropanolamine, diisopropanolamine and triisopropanolamine; polyalkylenepolyamines such as diethylenetriamine, triethylenetetramine, propylenediamine, N,N-diethylethylenediamine, 1,4-butanediamine, N-ethylethylenediamine, 1,2-propanediamine, 1,3-propanediamine and 1,6-hexanediamine; aliphatic amines such as 2-ethylhexylamine, dioctylamine, tributylamine, tripropylamine, triallylamine, heptylamine and cyclohexylamine; aromatic amines such as benzylamine and diphenylamine; cyclic amines such as piperazine, N-methyl-piperazine, methyl-piperazine and hydroxyethylpiperazine, and the like.

Examples of the quaternary ammonium hydroxide include tetramethylammonium hydroxide (TMAH), trimethyl(2-hydroxyethyl)ammonium hydroxide, tetraethylammonium hydroxide, tetrapropylammonium hydroxide, tetrabutylammonium hydroxide, methyltripropylammonium hydroxide, methyltributylammonium hydroxide, and the like.

Also, these detachment solutions may contain a non-amine water-soluble organic solvent. Examples of the non-amine water-soluble organic solvent include sulfoxides such as dimethylsulfoxide; sulfones such as dimethylsulfone, diethylsulfone, bis(2-hydroxyethyl)sulfone and tetramethylenesulfone; amides such as N,N-dimethylformamide, N-methylformamide, N,N-dimethylacetamide, N-methylacetamide and N,N-diethylacetamide; lactams such as N-methyl-2-pyrrolidone, N-ethyl-2-pyrrolidone, N-hydroxymethyl-2-pyrrolidone and N-hydroxyethyl-2-pyrrolidone; lactones such as β-propiolactone, γ-butyrolactone, γ-valerolactone, δ-valerolactone, γ-caprolactone and ε-caprolactone; imidazolidinones such as 1,3-dimethyl-2-imidazolidinone, 1,3-diethyl-2-imidazolidinone and 1,3-diisopropyl-2-imidazolidinone; polyhydric alcohols such as ethylene glycol, ethylene glycol monomethyl ether, ethylene glycol monoethyl ether, ethylene glycol monobutyl ether, ethylene glycol monoacetate, ethylene glycol monomethyl ether acetate, ethylene glycol monoethyl ether acetate, diethylene glycol, diethylene glycol monoacetate, diethylene glycol monomethyl ether, diethylene glycol monoethyl ether, diethylene glycol monobutyl ether, propylene glycol, propylene glycol monomethyl ether, dipropylene glycol monomethyl ether, glycerin, 1,2-butylene glycol, 1,3-butylene glycol and 2,3-butylene glycol, and derivatives thereof. These may be used alone, or as a mixture of two or more.

As the acidic detachment solution, for example, diluted hydrofluoric acid, buffered hydrofluoric acid, and the like may be exemplified.

In other method of detachment, etching by using a fluorine-containing gas also permits the detachment.

In the foregoing, the case in which the protective layer is formed on the entire surface of the substrate is explained; however, the protective layer may be formed only on a particular region of the substrate, and only such a particular region can be masked. In this case, the protective layer may be subjected to patterning. For the patterning, the protective layer may be etched using a resist, or the protective layer itself may be partially and selectively coated by a method such as printing.

EXAMPLES

The present invention is described in more detail below with reference to Examples, but it is not to be construed as being limited thereto.

Example 1

First, gallium (III) chloride and ethanol were mixed to prepare a 1% by mass ethanolic solution. After tetraethoxysilane was separately subjected to condensation polymerization in the presence of a HCl catalyst in ethanol, the product was diluted with ethanol so as to give the $SiO_2$ content of 11%, whereby a base coating liquid was prepared. In the condensation polymerization, the condition was adjusted to give the hydrolysis rate of 50%. The 1% by mass (gallium+ ethanol) solution was then mixed with the base coating liquid such that the gallium content became 100 ppm to obtain a film-forming composition.

After coating the film-forming composition on a silicon wafer (4 inches/CZ-P <100>: manufactured by Shin-Etsu Chemical Co., Ltd.), and baking at 200° C., a protective layer was formed by sintering at 500° C. for 30 min in the air. In the coating, the formed protective layer was adjusted to have a film thickness of about 2,700 Å. A material for phosphorus-doped SOG (Spin On Glass) (T-1P-59220: manufactured by Tokyo Ohka Kogyo Co., Ltd.) was coated on the protective layer, and baked at 200° C. to form a diffusion layer. This diffusion layer was adjusted to have a film thickness of about 2,800 Å. Thereafter, phosphorus was diffused into the silicon wafer at 930° C. for 30 min while allowing nitrogen to flow at a rate of 3 LR/min.

Examples 2 to 3

Reference Example 1

The sintering temperature for forming the protective layer in Example 1 was changed to 600° C. in Example 2, and to 700° C. in Example 3. Also, the diffusion layer in Example 1 was not formed in Reference Example 1.

Examples 4 to 6

Reference Example 2

The film-forming composition in Example 1 adjusted to have the gallium content of 10 ppm was used, and the sintering temperature in forming the protective layer was changed to 500° C., 600° C., and 700° C., respectively, in Examples 5 to 7. Also, the diffusion layer in Example 4 was not formed in Reference Example 2.

Examples 7 to 12

Reference Examples 3, 4

The gallium (III) chloride in Examples 1 to 6 and Reference Examples 1 and 2 was changed to aluminum nitrate, and the aluminum content was adjusted similarly to the gallium content, respectively, in Examples 7 to 12, and Reference Examples 3 and 4.

Comparative Examples 1 to 6

The protective layer in Examples 1 to 3 and Reference Example 1 was formed using the base coating liquid (the film without addition of the protective element) in Comparative Examples 1 to 3. In addition, the protective layer in Example 1 was not formed and only the diffusion layer was formed in Comparative Example 5, and the protective layer and the diffusion layer were not formed in Example 1 and the wafer alone was used in Comparative Example 6.

Comparative Examples 7 to 10

In Comparative Examples 7 and 8, the protective layer was formed by sintering at 500° C. and 700° C., respectively, after coating a $TiO_2$ based film-forming composition (Ti-5000T: manufactured by Tokyo Ohka Kogyo Co., Ltd.) as the film-forming composition on the silicon wafer (4 inches/CZ-P <100>: manufactured by Shin-Etsu Chemical Co., Ltd.). Additionally, in Comparative Examples 9 and 10, phosphorus was diffused at 930° C. in a similar manner to Example 1 after having formed the protective layer similarly to Comparative Examples 7 and 8, respectively.

Test Example 1

Evaluation of Protective Film

The resistance value of the silicon wafer in each of Examples 1 to 12, Reference Example and Comparative Examples 1 to 6 was measured to evaluate the protective film. Conditions of production, and resistance value in each of the Examples are shown in from Table 1 to Table 3.

TABLE 1

| | Condition | | | | | Resistance ($\Omega$/cm) | | |
|---|---|---|---|---|---|---|---|---|
| | First layer | Protective element content | Protective film sintering temperature (° C.) | Film thickness (Å) | Second layer | Average | Maximum | Minimum |
| Example 1 | Ga | 100 ppm | 500 | 1910 | phosphorus-doped SOG | 854.5 | 916.2 | 753.6 |
| Example 2 | Ga | 100 ppm | 600 | 1850 | phosphorus-doped SOG | 764.2 | 863.7 | 679.8 |
| Example 3 | Ga | 100 ppm | 700 | 1773 | phosphorus-doped SOG | 196.0 | 202 | 193 |
| Reference Example 1 | Ga | 100 ppm | 500 | 1913 | — | 195.4 | 200 | 193 |
| Example 4 | Ga | 10 ppm | 500 | 1896 | phosphorus-doped SOG | 651.5 | 707.9 | 606.0 |
| Example 5 | Ga | 10 ppm | 600 | 1858 | phosphorus-doped SOG | 894.7 | 1076 | 693.8 |
| Example 6 | Ga | 10 ppm | 700 | 1797 | phosphorus-doped SOG | 251.7 | 323 | 213 |
| Reference Example 2 | Ga | 10 ppm | 500 | 1919 | — | 198.9 | 203 | 197 |

TABLE 2

| | Condition | | | | | Resistance ($\Omega$/cm) | | |
|---|---|---|---|---|---|---|---|---|
| | First layer | Protective element content | Protective film sintering temperature (° C.) | Film thickness (Å) | Second layer | Average | Maximum | Minimum |
| Example 7 | Al | 100 ppm | 500 | 1916 | phosphorus-doped SOG | 928.7 | 1014 | 831.1 |
| Example 8 | Al | 100 ppm | 600 | 1839 | phosphorus-doped SOG | 797.7 | 936.6 | 656.3 |
| Example 9 | Al | 100 ppm | 700 | 1763 | phosphorus-doped SOG | 197.0 | 203 | 194 |
| Reference Example 3 | Al | 100 ppm | 500 | 1915 | — | 198.8 | 202 | 197 |
| Example 10 | Al | 10 ppm | 500 | 1914 | phosphorus-doped SOG | 647.8 | 754.1 | 586.1 |
| Example 11 | Al | 10 ppm | 600 | 1854 | phosphorus-doped SOG | 918.7 | 1055 | 831.5 |
| Example 12 | Al | 10 ppm | 700 | 1781 | phosphorus-doped SOG | 251.6 | 384 | 217 |
| Reference Example 4 | Al | 10 ppm | 500 | 1906 | — | 199.2 | 210 | 197 |

TABLE 3

| | Condition | | | | | Resistance (Ω/cm) | | |
|---|---|---|---|---|---|---|---|---|
| | First layer | Protective element content | Protective film sintering temperature (° C.) | Film thickness (Å) | Second layer | Average | Maximum | Minimum |
| Comparative Example 1 | SiO$_2$ | 0 | 500 | 1848 | phosphorus-doped SOG | 336.0 | 344 | 323 |
| Comparative Example 2 | SiO$_2$ | 0 | 600 | 1803 | phosphorus-doped SOG | 496.1 | 539.0 | 470.1 |
| Comparative Example 3 | SiO$_2$ | 0 | 700 | 1741 | phosphorus-doped SOG | 849.5 | 911.1 | 770.8 |
| Comparative Example 4 | SiO$_2$ | 0 | 500 | 1878 | — | 196.7 | 209 | 193 |
| Comparative Example 5 | phosphorus-doped SOG | — | — | — | — | 47.3 | 51.0 | 44.5 |
| Comparative Example 6 | bare wafer alone | — | — | — | — | 199.8 | 203 | 197 |

Figure 1:
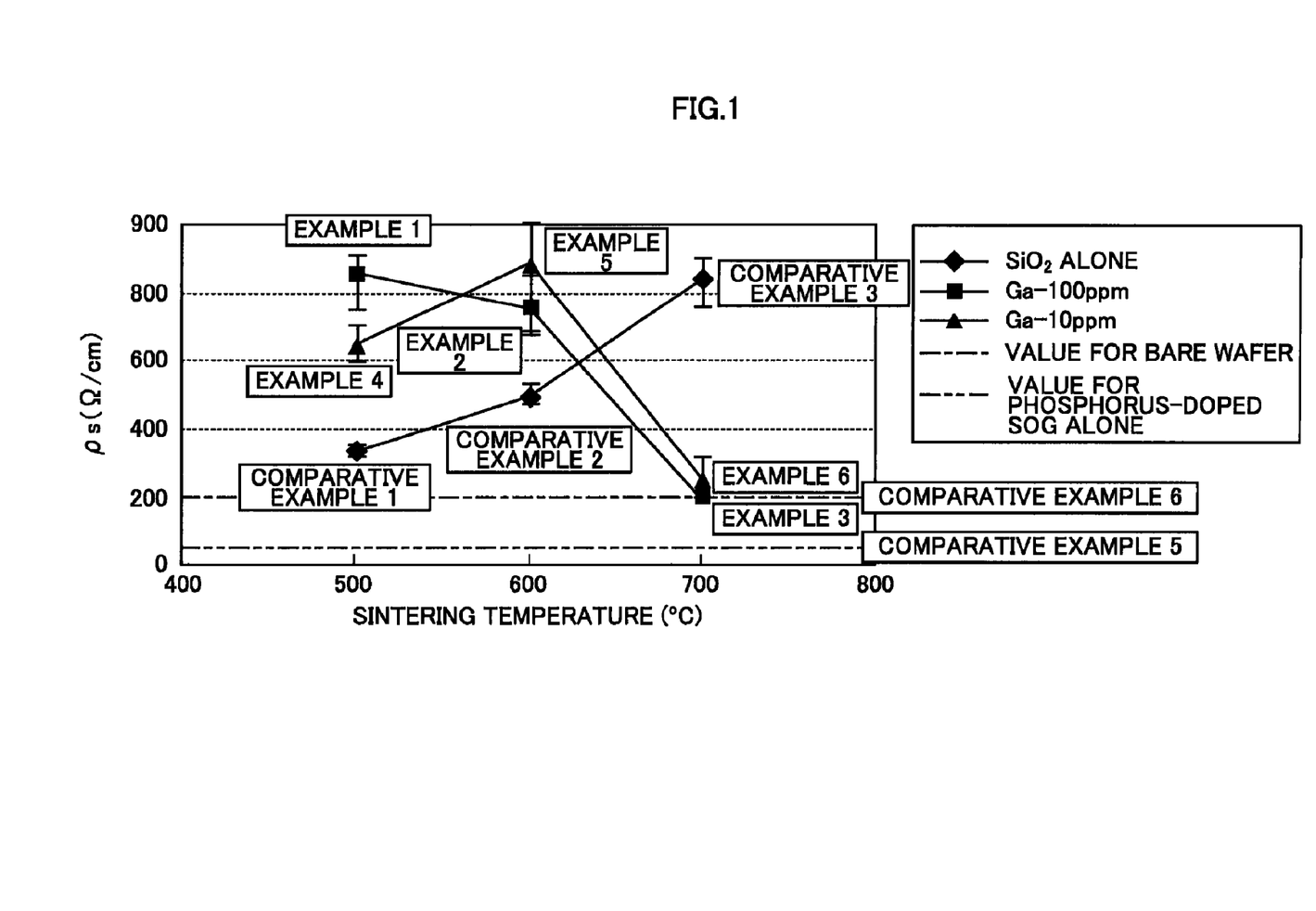
FIG. 1 shows a graph illustrating a relationship between the sintering temperature and the resistance value when gallium is used as the protective element.
Figure 2:
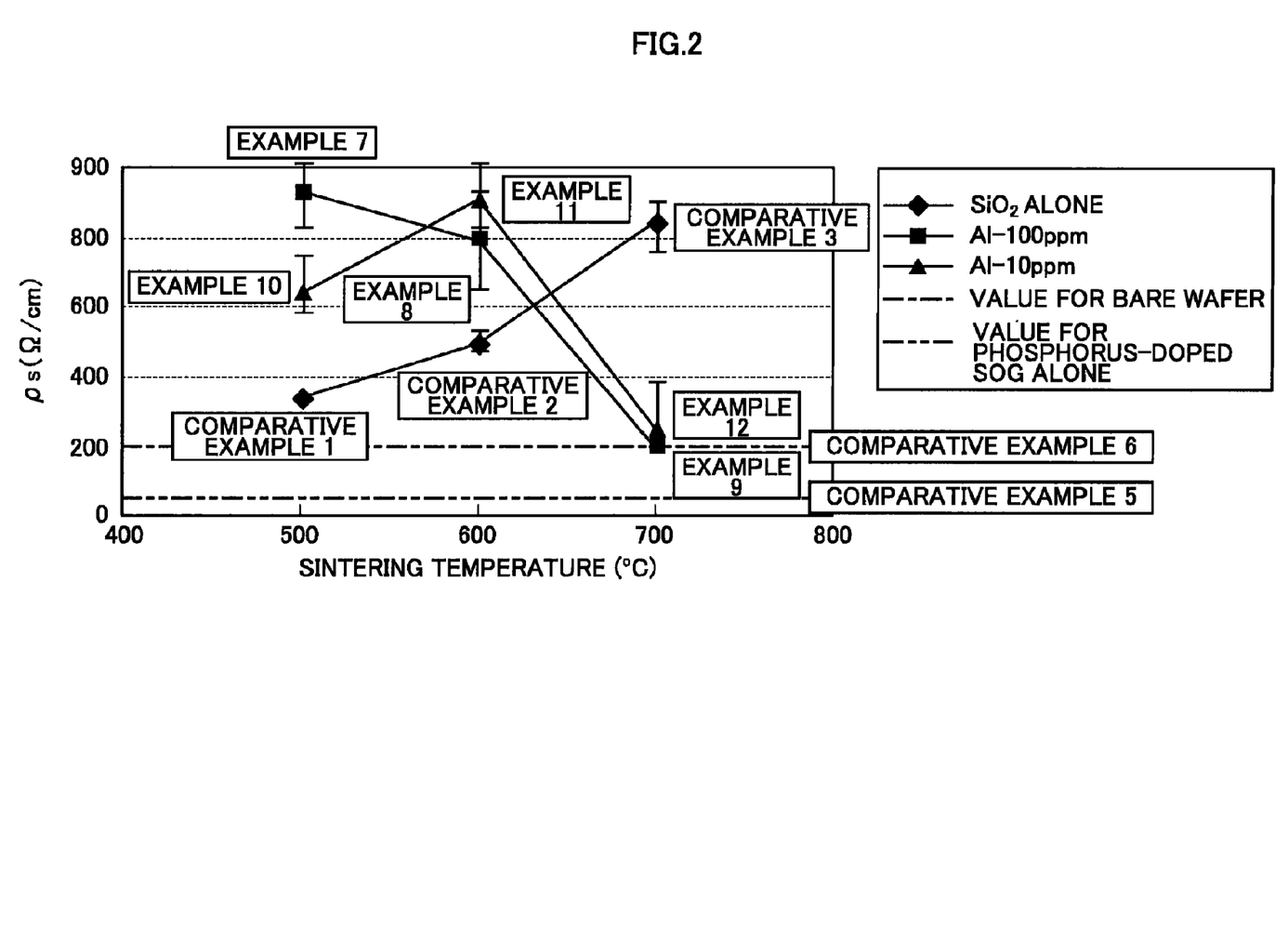
FIG. 2 shows a graph illustrating a relationship between the sintering temperature and the resistance value when aluminum is used as the protective element.

The relationship between the sintering temperature and the resistance value when gallium was used as the protective element is shown in FIG. 1, and the relationship between the sintering temperature and the resistance value when aluminum was used as the protective element is shown in FIG. 2.

As shown in FIG. 1, it was verified that the resistance value was high, revealing failure in sufficient protection, in Comparative Example 3 in which SiO$_2$ alone was used and the sintering temperature was 700° C., as compared with Comparative Example 6 in which the bare wafer alone was used. In addition, comparison of Example 3 with Comparative Example 6 verified that the diffusion of phosphorus could be prevented (protective effect), since almost no alteration of the resistance value was found in Example 3 and Comparative Example 6. Moreover, Example 3 and Example 6 could verify dependency on the amount of the added protective element.

Figure 3:
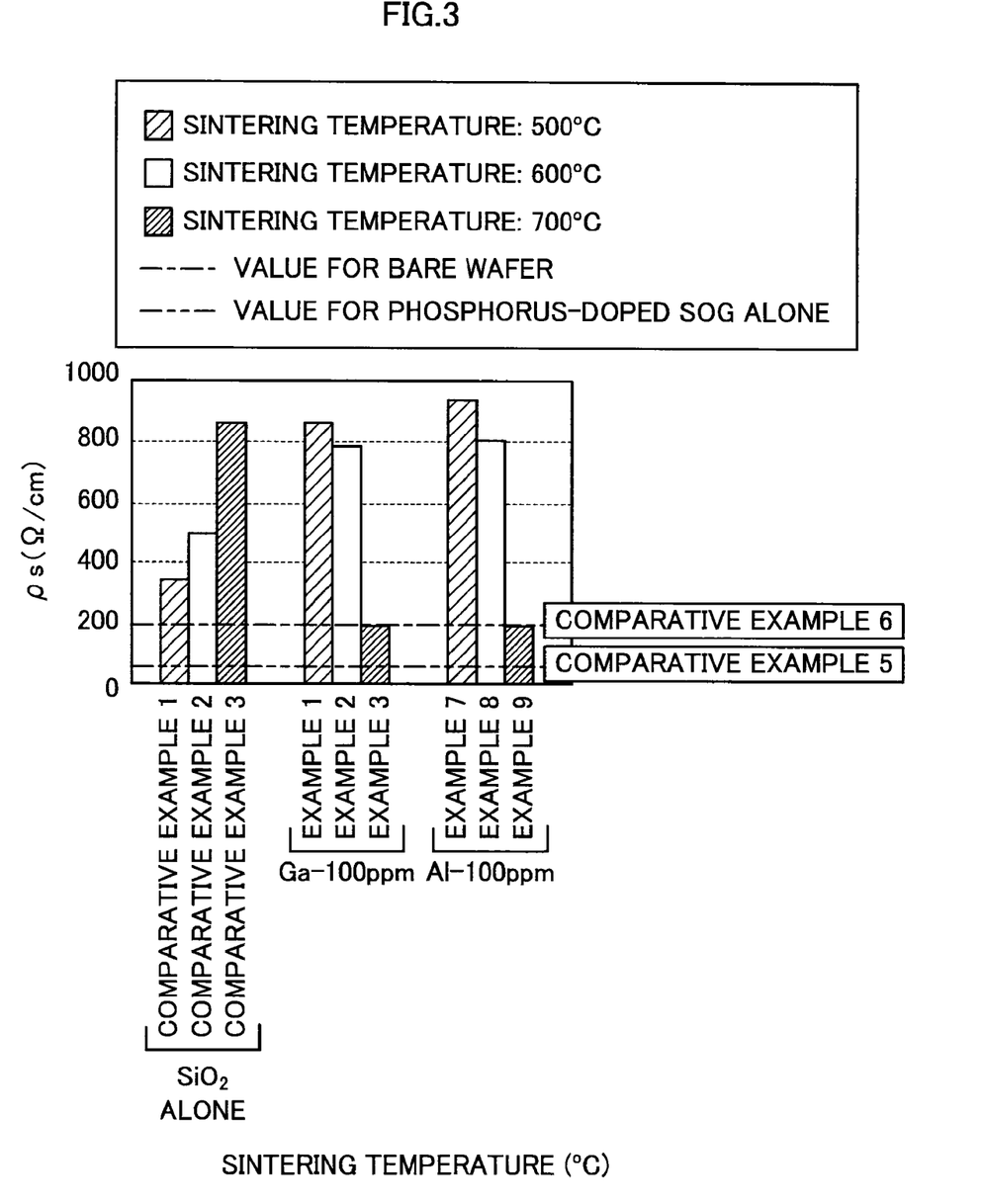
FIG. 3 shows a graph illustrating a relationship between the sintering temperature and the resistance value when the content of the protective element is 100 ppm.
Figure 4:
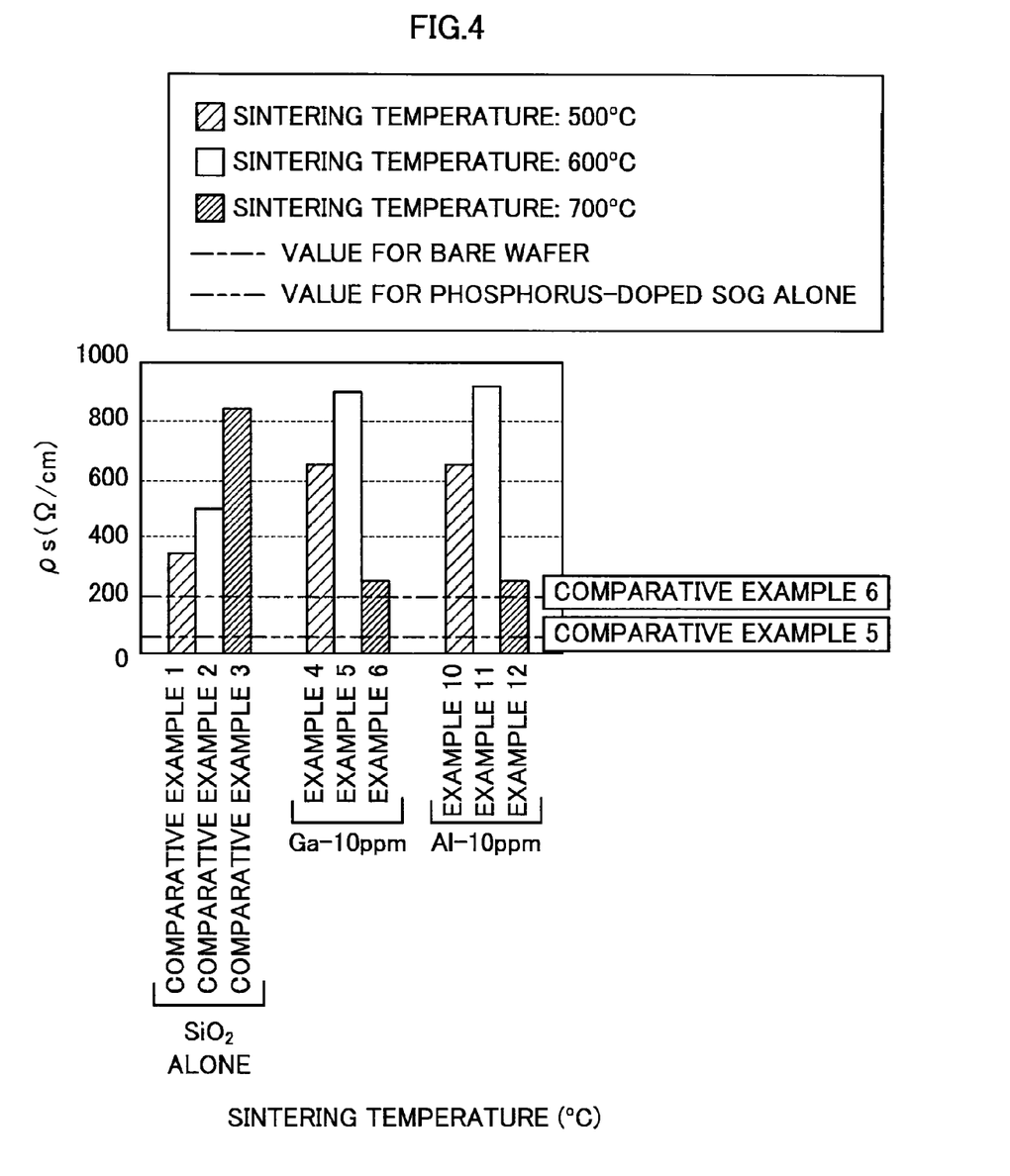
FIG. 4 shows a graph illustrating a relationship between the sintering temperature and the resistance value when the content of the protective element is 10 ppm.

As shown in FIG. 2, also in the cases in which aluminum was used as the protective element as in Example 9 and Example 12, the protective effect, and the dependency on the amount of addition could be verified similarly to gallium. Also, as shown in FIG. 3 and FIG. 4, the protective effect could be achieved to a comparable extent to gallium.

In Reference Examples 1 to 6 in which the material for phosphorus-doped SOG was not coated on the upper layer, almost no difference in the resistance value from that in Comparative Example 6 could be found. Therefore, it could be ascertained that the protective layer formed using the film-forming composition of the present invention had no influence on the resistance value of the protective element for the substrate.

Test Example 2

Detachment Test of Protective Layer

The silicon wafers after the diffusion in Examples 1 to 12, and Comparative Examples 7 to 10 were subjected to a detachment test of the protective layer by hydrofluoric acid. In the test, the degrees of detachment after immersing in hydrofluoric acid for a certain time period were compared. The comparison was made based on visually observed color change. As for the silicon wafers after the diffusion in Examples 1 to 12, the protective layer could be detached by immersing in 5% hydrofluoric acid for 5 min. In contrast, with respect to Comparative Examples 7 and 8, the protective layer could not be detached even after immersion in 5% hydrofluoric acid for 20 min, but could be detached by immersing in 50% hydrofluoric acid for 5 min. In addition, with respect to Comparative Examples 9 and 10, the protective layer could not be detached even after immersion in 5% hydrofluoric acid for 20 min, and could not also be detached by immersing in 50% hydrofluoric acid for 5 min. From the foregoing, it is clear that the detachment is difficult in the case of the Ti-based film-forming composition, while the detachment could be readily conducted in the case of the Si-based film-forming composition.

The invention claimed is:

1. A film-forming composition for constituting a protective film provided in diffusing a dopant into a silicon wafer, for partially preventing the diffusion of the dopant, the composition comprising a siloxane polymer compound, and a compound comprising a protective element which is to have eight valence electrons through covalently binding with an element to be a diffusion source used in diffusing the dopant, wherein the protective element is included in the film-forming composition at a content of no lower than 10 ppm by mass to no higher than 100 ppm by mass.

2. The film-forming composition according to claim 1, wherein the protective element is at least one selected from gallium and aluminum.

3. The film-forming composition according to claim 1, wherein the protective element is one or more selected from phosphorus, tantalum, niobium, arsenic, or antimony.

4. The film-forming composition according to claim 1, wherein the compound comprising the protective element is a salt or alkoxide including the protective element.

5. A protective film produced by coating the film-forming composition according to claim 1 on a silicon wafer, and sintering at no lower than 400° C. and no higher than 900° C.

6. The protective film according to claim 5 having a film thickness of no less than 500 Å.

* * * * *